United States Patent [19]

Kitamura

[11] Patent Number: 4,531,217
[45] Date of Patent: Jul. 23, 1985

[54] SEMICONDUCTOR LASER DEVICE WITH PLURAL LIGHT SOURCES

[75] Inventor: Takashi Kitamura, Yokohama, Japan

[73] Assignee: Canon Kabushiki Kaisha, Tokyo, Japan

[21] Appl. No.: 599,205

[22] Filed: Apr. 12, 1984

Related U.S. Application Data

[63] Continuation of Ser. No. 326,268, Dec. 1, 1981, abandoned.

[30] Foreign Application Priority Data

Dec. 8, 1980 [JP] Japan .................. 55-172976

[51] Int. Cl.³ .............................. H01S 3/19
[52] U.S. Cl. ......................... 372/50; 357/17; 372/38; 372/46
[58] Field of Search ............ 372/46, 50, 38, 44, 372/45; 357/17, 47, 40, 45, 55

[56] References Cited

U.S. PATENT DOCUMENTS 4,069,463 1/1978 McGroddy et al. ............ 372/36
4,236,296 12/1980 Woolhouse et al. ............ 372/50
4,331,938 5/1982 Limm et al. .................... 372/50

FOREIGN PATENT DOCUMENTS 0138890 10/1980 Japan ............................ 372/36

OTHER PUBLICATIONS

Blum et al., "Double Heterojunction Laser Arrays", IBM Technical Disclosure Bulletin, vol. 15, No. 7, Dec. 1972, p. 2345.

Primary Examiner—James W. Davie
Attorney, Agent, or Firm—Fitzpatrick, Cella, Harper & Scinto

[57] ABSTRACT

A semiconductor laser device has a high switching speed and low cost, and comprises a common electrode, on the surface of a P-type semiconductor wafer forming plural light sources. The semiconductor laser device is further featured by having grooves provided on said semiconductor wafer to allow independent drive of said light sources and to reduce the distance between the light-emitting points of the light sources.

7 Claims, 6 Drawing Figures

SEMICONDUCTOR LASER DEVICE WITH PLURAL LIGHT SOURCES

This application is a continuation of application Ser. No. 326,268 filed Dec. 1, 1981, now abandoned.

BACKGROUND OF THE INVENTION

1. Field of the Invention

The present invention relates to a semiconductor laser device having independently drivable plural light sources on a single semiconductor wafer.

2. Description of the Prior Art

There are already known laser beam printers in which an image is formed by an electrophotographic process by exposing a photosensitive member to a laser beam. In such laser beam printers conventional gas lasers are being replaced by semiconductor lasers to achieve miniaturization and reduce manufacturing costs. However the use of such semiconductor lasers has been limited to the printers of relatively low speed since the ordinary GaAlAs semiconductor laser, having an oscillating wavelength in the near infrared region of 760 to 900 nm, does not match the sensitivity of the photosensitive member and is limited in output power.

On the other hand, laser beam printers of higher speed and lower cost are demanded in order to handle increasing information, and for this purpose considered presently is the so-called semiconductor laser array in which independently drivable plural light sources are formed on a single semiconductor wafer.

In the use of such semiconductor laser arrays in a laser beam printer the following conditions are desirable:

(1) the light-emitting points should be positioned mutually close and equally spaced;
(2) the light sources should be independently drivable; and
(3) the P-side electrodes of the semiconductor laser can be made common for all the light sources.

In the use of a semiconductor laser in a laser beam printer, the associated optical system generally has a magnification of a multiple of ten, so that the distance between the spots focused for recording is considerably expanded to several millimeters or even to several centimeters. For this reason the semiconductor laser array is easier to use if the light-emitting points thereof are positioned mutually close as indicated in condition (1). Also condition (2) is quite natural but is rather difficult to achieve in a semiconductor laser with an array structure. Particularly it is difficult to realize conditions (1) and (2) at the same time since the independent drive becomes more difficult as the light-emitting points are positioned closely.

This situation will become more clear with reference to FIG. 1A showing the current distribution in a semiconductor laser array, wherein a semiconductor laser 1 having two light-emitting points is composed of an N-GaAs substrate 10, an N-GaAlAs layer 11, a GaAs layer 12, a P-GaAlAs layer 13, an insulating layer 14 and electrodes 15 respectively having light-emitting points 16. In case of independent drive of these laser units by laser drivers 17, 18 through electrodes 15 which are provided commonly at the P-side of the semiconductor laser and individually at the N-side, there will be obtained a current distribution as represented by arrows 20. In this case independent drive is not possible because of the crosstalk current from one laser unit to the N-side electrode of the other laser unit.

FIG. 1B shows a structure in which the N-side electrode is made common for two units. In this case the current broadening is not a significant problem as the current is caught by the common electrode. In this manner the common electrode should be provided at the N-side in order to facilitate independent drive.

On the other hand, in consideration of the driver circuit it is desirable to have the common electrode at the P-side in order to achieve faster switching and lower cost. This situation will be explained in greater detail with reference to FIGS. 2A and 2B showing a driver circuit for a laser unit in a semiconductor laser array.

FIG. 2A outlines the circuit with the common electrode at the P-side, wherein a differential switch composed of NPN transistors 21, 22 controls the semiconductor laser 1 according to the image input signal from a terminal 30, and the current in this circuit is determined by the collector current of a current supply transistor 26.

Also FIG. 2B shows the circuit with the common electrode at the N-side, wherein a differential switch composed similarly of PNP transistors 24, 25 controls the semiconductor laser 1 according to the image input signal from a terminal 30.

In general, in comparison with PNP transistors, NPN transistors are superior in speed and current capacity and still are less expensive. An example of such NPN transistors is an epitaxial silicon transistor 2SC97A for high-speed switching supplied by Nihon Denki Co. Also an example of such PNP transistor is an element 2SA571 for complimentary use supplied from the same company. The properties of these transistors are compared in the following table.

|        | Collector max. current | Collector capacity | Turn-on time | Turn-off time |
|--------|------------------------|--------------------|--------------|---------------|
| 2SC97A | 1.0 A                  | 6 pF               | 15 ns        | 60 ns         |
| 2SA571 | −1.0 A                 | 16 pF              | 25 ns        | 110 ns        |

As will be seen from this table, the NPN transistor is apparently superior in the high-speed switching performance. On the other hand, a PNP transistor, having high-speed performance, would be very expensive and have a lower collector maximum current.

As explained in the foregoing, the aforementioned three conditions are generally difficult to satisfy at the same time in a semiconductor laser device with an array structure.

SUMMARY OF THE INVENTION

A first object of the present invention is to provide a semiconductor laser device with an increased switching speed and with a reduced production cost.

A second object of the present invention is to provide a semiconductor laser device having independently drivable plural light sources on a semiconductor wafer.

A third object of the present invention is to provide a semiconductor laser device in which the distance between the light-emitting points of the light sources can be reduced.

DETAILED DESCRIPTION OF THE PREFERRED EMBODIMENTS

Figure 1A:
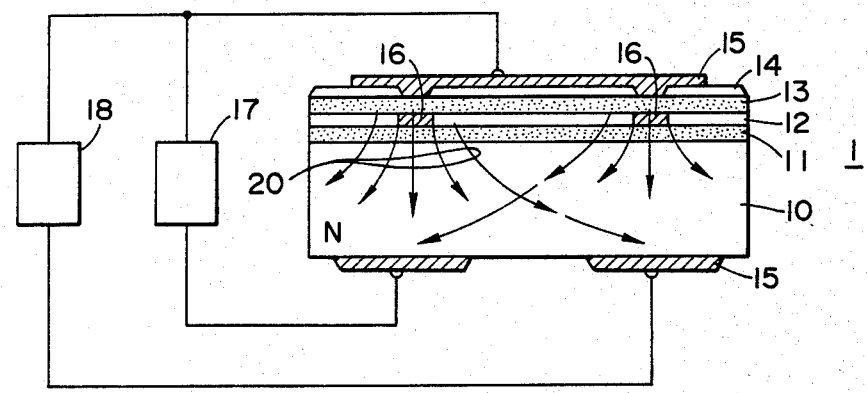
FIG. 1A is a cross-sectional view of a conventional semiconductor laser array with a common electrode at the P-side.
Figure 1B:
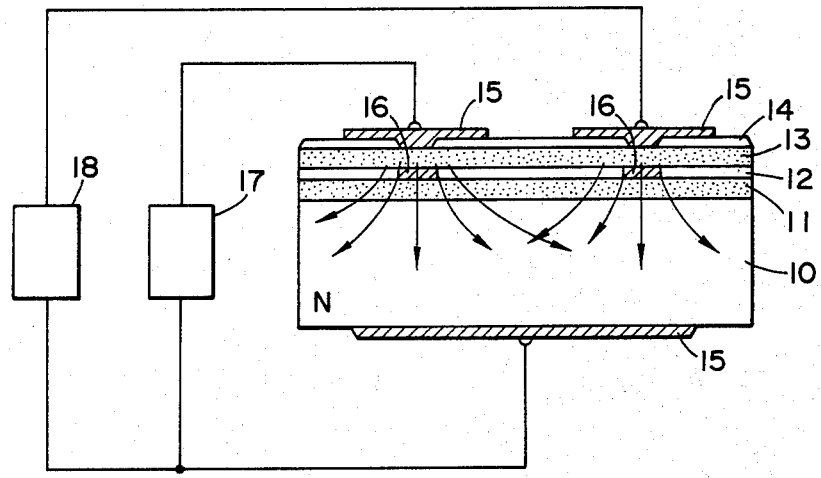
FIG. 1B is a cross-sectional view of a conventional semiconductor laser array with a common electrode at the N-side.
Figure 2A:
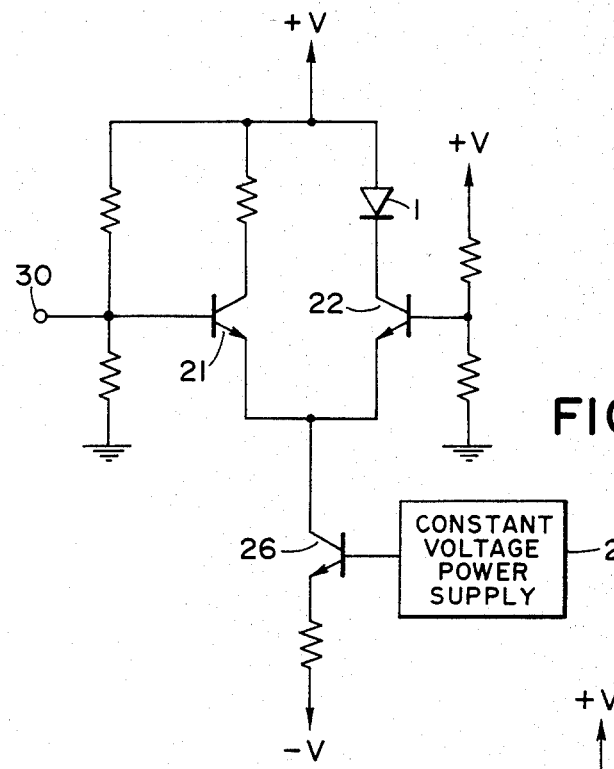
FIG. 2A is a diagram of the drive circuit for the semiconductor laser array with a common electrode at the P-side.
Figure 2B:
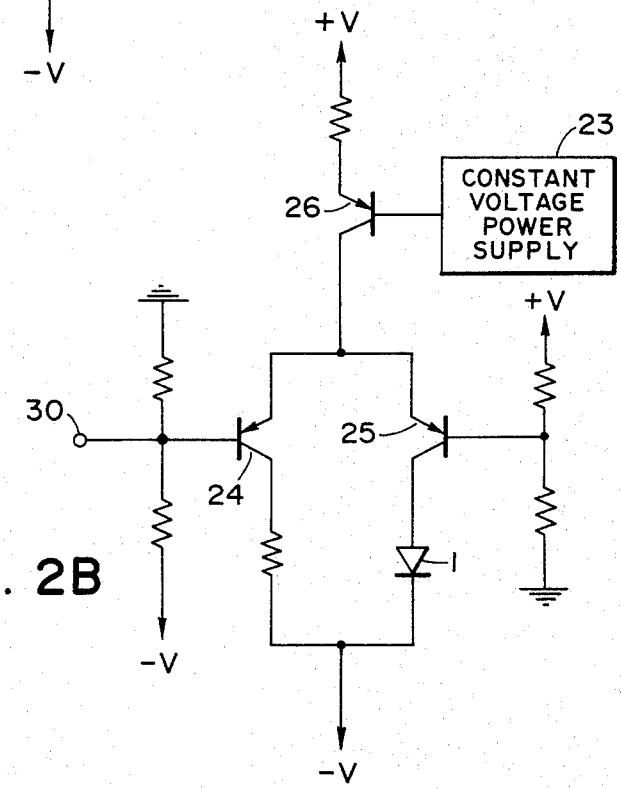
FIG. 2B is a diagram of the drive circuit for the semiconductor laser array with a common electrode at the N-side.
Figure 3:
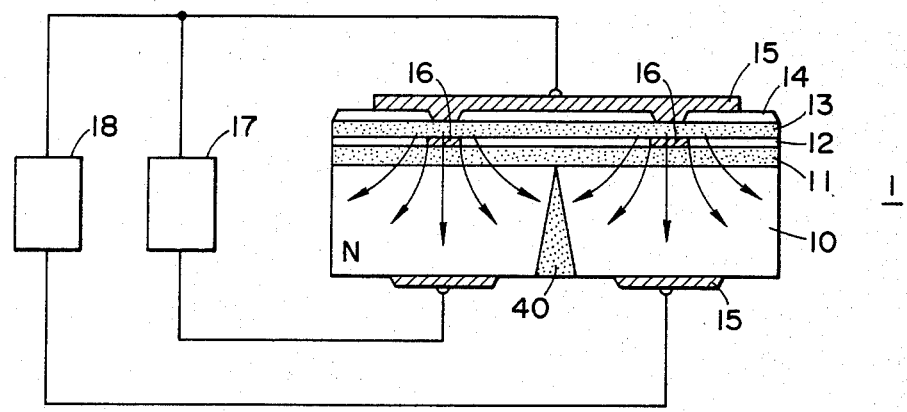
FIG. 3 is a cross-sectional view of a semiconductor laser device embodying the present invention.

FIG. 3 shows an embodiment of the present invention wherein a semiconductor laser element 1 is provided with a common electrode 15 at the P-side. In FIG. 3 the components which are the same as those shown in FIG. 1 are represented by the same numbers and are omitted from the following description.

In the present embodiment the crosstalk current is prevented by the presence of a V-sectioned groove 40 provided from the N-side of the element. Said groove should have a depth at least equal to ½ of the thickness of the element, but is preferably extended to the vicinity of the active layer in order to achieve complete isolation of the laser units.

Figure 4:
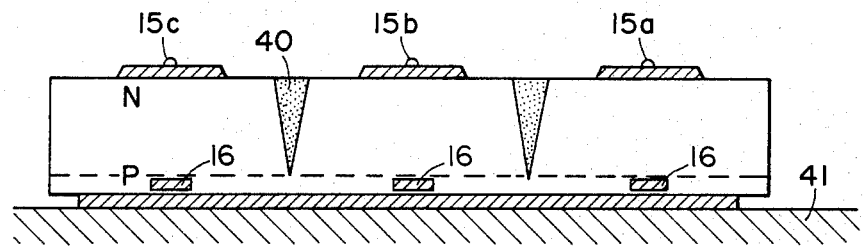
FIG. 4 is an explanatory view for providing grooves 40.

The groove can be formed in the following manner. As shown in FIG. 4, a semiconductor laser element, having three units in this case, is adhered at the P-side thereof to a mount 41 by means, for example, of indium. The adhesion is made at the P-side in order to obtain a common connection for the electrodes by means of the mount composed for example of copper, and to dissipate the heat generated in the vicinity of the light-emitting point positioned close to the P-side surface toward the mount 41 as a heat sink.

Then grooves 40 are formed on the laser array. The groove formation can be achieved easily and precisely for example with a laser trimming apparatus for trimming operation with a laser beam. The presence of the mount 41 facilitates the groove forming operation due to the increased mechanical strength of the element.

Also the grooves can be prepared by an etching process.

As explained in the foregoing, the semiconductor laser array of the present invention, being provided with grooves formed from the N-side face of the semiconductor wafer toward the P-side face thereof, permits the light sources to be independently driven, the distance between the light-emitting points of the light sources to be reduced, and a common electrode to be at the P-side, thus enabling the use in combination of NPN transistors which are capable of high-speed switching and are still inexpensive.

What I claim is:

1. In a semiconductor laser device having a plurality of light sources, the improvement comprising:
    a substrate including an N-type semiconductor;
    a plurality of layers on one surface of said substrate;
    a plurality of electrodes on the other surface of said substrate;
    a plurality of light-emitting points in one of said plurality of layers and each corresponding to one of said plurality of electrodes;
    a common electrode on a surface of said plurality of layers farthest from said substrate and corresponding to said plurality of electrodes; and
    grooves each of which is in said substrate between adjacent ones of said plurality of electrodes.

2. A semiconductor laser device according to claim 1, wherein each of said grooves has a substantially V-shaped cross section with a gradually decreasing width from said substrate toward said plurality of layers.

3. A semiconductor laser device according to claim 5, wherein each of said grooves has a substantially V-shaped cross section with a gradually decreasing width from said substrate toward said plurality of layers.

4. A semiconductor laser device according to claim 3, wherein each of said first and second differential switching circuits further comprises a current source transistor whose base is connected to a constant voltage power supply and wherein the emitters of said pairs of NPN transistors are connected to the collector of said current source transmitter.

5. In a semiconductor laser device having a plurality of light sources, the improvement comprising:
    a substrate including an N-type semiconductor;
    a plurality of layers on one surface of said substrate;
    a plurality of electrodes on the other surface of said substrate;
    a plurality of light-emitting points in one of said plurality of layers and each corresponding to one of said plurality of electrodes;
    a common electrode on a surface of said plurality of layers farthest from said substrate and corresponding to said plurality of electrodes;
    grooves each of which is between adjacent ones of said plurality of electrodes; and
    a first and a second differential switching circuit each comprising resistor means and a pair of NPN transistors with their emitters connected to each other and to said common electrode, the collector of one of said pair of transistors of the first circuit being connected through said resistor means of the first circuit to one of said plurality of electrodes and the collector of one of said pair of transistors of the second circuit being connected through said resistor means of the second circuit to a different one of said plurality of electrodes.

6. A semiconductor laser device according to claim 5, wherein said common electrode is composed of indium.

7. A semiconductor laser device according to claim 6, wherein each of said grooves has a substantially V-shaped cross section with a gradually decreasing width from said substrate toward said plurality of layers.

* * * * *